United States Patent [19]

Tamaki

[11] Patent Number: 5,254,213
[45] Date of Patent: Oct. 19, 1993

[54] METHOD OF FORMING CONTACT WINDOWS

[75] Inventor: Tokuhiko Tamaki, Sakai, Japan

[73] Assignee: Matsushita Electric Industrial Co., Ltd., Osaka, Japan

[21] Appl. No.: 601,986

[22] Filed: Oct. 23, 1990

[30] Foreign Application Priority Data

Oct. 25, 1989 [JP] Japan .................. 1-278839

[51] Int. Cl.⁵ .......................................... H01L 21/00
[52] U.S. Cl. ........................... 156/655; 156/657; 156/656; 156/665; 437/195; 437/228
[58] Field of Search .............. 156/643, 646, 665, 656, 156/657, 654, 655; 437/195, 228

[56] References Cited

U.S. PATENT DOCUMENTS

| | | | |
|---|---|---|---|
| 4,547,261 | 10/1985 | Maa et al. | 156/643 |
| 4,615,764 | 10/1986 | Bobbio et al. | 156/657 |
| 4,855,017 | 8/1989 | Douglas | 156/646 |
| 4,857,141 | 8/1989 | Abe et al. | 156/646 |
| 4,873,176 | 10/1989 | Fisher | 156/643 |
| 4,948,459 | 8/1990 | Van Laarhoven et al. | 156/656 |
| 4,985,373 | 1/1991 | Levinstein et al. | 437/195 |

FOREIGN PATENT DOCUMENTS 1-133323 5/1989 Japan.
3-204928 9/1991 Japan.

*Primary Examiner*—Brian E. Hearn
*Assistant Examiner*—George Goudreau
*Attorney, Agent, or Firm*—Ratner & Prestia

[57] ABSTRACT

A method of forming contact windows in an insulating layer is disclosed. The contact windows extend down to an underlying metal layer which is formed under the insulating layer. The method comprises the steps of: forming an etching mask layer having openings for defining contact window regions of the insulating layer on the insulating layer; and performing an etching process using an etching gas to which a gas containing nitrogen atoms has been added, thereby etching away the contact window regions of the insulating layer through the openings of the etching mask layer to form the contact windows.

7 Claims, 7 Drawing Sheets

3.0 μm

METHOD OF FORMING CONTACT WINDOWS

BACKGROUND OF THE INVENTION

1. Field of the Invention:

This invention relates to a method of forming contact windows and more particularly to a method of forming contact windows in an insulating layer which is deposited over metal layers in a fabrication process of semiconductor devices having a multi-level interconnection structure.

2. Description of the Prior Art:

Semiconductor integrated circuit devices comprise fine line patterns of wiring layer for electrically interconnecting transistors and other circuit elements formed on a semiconductor substrate. As the number of circuit elements integrated on the semiconductor substrate increases, the size of the circuit elements and the distance between the circuit elements become smaller and smaller. Semiconductor devices having a multi-level interconnection structure are being developed to facilitate interconnection between such high density circuit elements.

FIG. 4 shows a cross sectional view of a fragmentary portion of a semiconductor device having a two-level interconnection structure. The semiconductor device shown in FIG. 4 comprises a silicon substrate 30, isolation oxides 31 formed in isolation regions on the surface of the silicon substrate 30, MOSFETs 36a and 36b formed in element regions on the silicon substrate 30, a first insulating layer 32 which covers the MOSFETs 36a and 36b, first metal layer 33 for interconnecting the MOSFETs 36a and 36b and so on, a second insulating layer 34 which covers the first metal layer 33, and second metal layer 35 formed on the second insulating layer 34.

The MOSFETs 36a and 36b each comprise impurity diffusion layers (functions as source and drain) 38 formed in prescribed parts of the element regions of the silicon substrate 30, the gate oxide 39 formed on the element region, and the gate electrode 41 formed on the gate oxide 39.

The first metal layer 33 and the second metal layer 35 are in contact with each other through contact windows 40 formed at prescribed regions in the second insulating layer 34.

The prior art method of forming the contact windows 40 in the second insulating layer 34 is described below. The second insulating layer 34 is deposited over the silicon substrate 30 so it covers the first metal layer 33. A CVD method is used as a deposition method. A photoresist layer (not shown) which functions as an etching mask layer is then formed on the second insulating layer 34, after which contact regions of the photoresist layer are removed by a usual photolithography method. Thus, the etching mask layer (photoresist layer) having openings for defining contact window regions of the insulating layer 34 is formed on the insulating layer 34.

An etching process is then performed using an etching gas, thereby etching away the contact window regions of the second insulating layer 34 through the openings of the etching mask layer to form the contact windows. Those parts of the second insulating layer 34 covered by the photoresist do not come in contact with the etching gas due to the presence of the etching mask, so they are not etched.

The etching process is explained in greater detail below. The etching gas used in the etching process is selected based on the material of the insulating layer 34. For example, if the insulating layer 34 is made from silicon dioxide ($SiO_2$), a mixed gas containing $CHF_3$, $C_2F_6$, $O_2$ and He would be selected.

The etching process is performed using an RIE apparatus or other type of etching apparatus. When performing the etching process with a high anisotropy, the etching gas is partially ionized by a discharge between the electrodes in the etching apparatus and changed to a plasma.

FIG. 5 shows a mechanism of a contact window formation in the second insulating layer 34 by the etching process using the etching gas plasma. As shown in FIG. 5, ions generated in the etching gas plasma are accelerated across the sheath potential (not shown) toward the silicon substrate 30, and the ions bombard the photoresist 37 and the second insulating layer 34 over the silicon substrate 30. A contact window region of the second insulating layer 34 not covered by the photoresist layer 37 are effectively etched with the assistance of the ions. The energy of the ions accelerated across the sheath potential depends on the RF power of the discharge, since the sheath potential is generated by the discharge.

As the etching progresses, a polymer film (deposit 38) containing carbon atoms is deposited on the side wall of the contact window 40 and the photoresist 37. Especially, if the second insulating layer 34 is a TEOS layer formed from TEOS (tetraethyl orthosilicate), the high carbon content of the TEOS layer causes a thick accumulation of deposit 38 to form. The presence of the deposited film 38 prevents etching of the side wall of the contact window 40. Therefore, the etching of the second insulating layer 34 progresses perpendicularly to the surface of the silicon substrate 30 through the opening of the photoresist 37, thus facilitating the formation of contact windows with a high aspect ratio.

The above method of forming contact windows results in sputtering of the surface of the first metal layer 33 by the ions after the surface has been exposed to ion bombardment through the contact window 40. The metal or metal compounds sputtered from the surface of the first metal layer 33 are implanted into the photoresist 37 near the contact window 40 or the deposit 38 on the side wall of the contact window 40. This causes the surfaces of the photoresist 37 and the deposit 38 to harden. The photoresist 37 or deposit 38 whose surface has become hardened is difficult to remove from the wafer. Therefore, the hardened photoresist 37 or deposit 38 remains near the contact window 40 even after a resist-removing process for removing the photoresist 37 by using $O_2$ plasma ashing technique and a cleaning process for cleaning the surface of the silicon substrate 30 are performed.

FIG. 3 shows the deposits 38 remaining near the contact windows 40. This is an is perspective view drawn from scanning electron micrographs. The contact windows 40 in FIG. 3 are formed in the second insulating layer 34 (made of a TEOS layer) covering the first wiring layer 33 (made of aluminum). The etching of the second insulating layer 34 performed by using an etching gas mixture of $CHF_3$, $O_2$ and He to form the contact windows. The flow rates of $CHF_3$, $O_2$ and He were 90 sccm, 10 sccm and 100 sccm, respectively.

The etching apparatus used was a normal reactive ion etching (RIE) apparatus. The etching was performed over the period of time it would take to etch an insulating layer 1.5 times thicker than the second insulating layer 34. This type of etching is referred to as "50% over-etching".

As shown in FIG. 3, hardened deposits 38 remain inside and around the contact windows 40. The deposits 38 degrades the interconnection between the second metal layer 35 and the first metal layer 33 via the contact windows 40. This results in such contact failures as open circuits, which reduces the production yield and reliability of the semiconductor devices.

SUMMARY OF THE INVENTION

According to the invention, a method of forming contact windows in an insulating layer, said contact windows extending down to an underlying metal layer which is formed under said insulating layer, is provided, which overcomes the above-discussed and numerous other disadvantages and deficiencies of the prior art, said method comprises the steps of: forming an etching mask layer having openings for defining contact window regions of said insulating layer on said insulating layer; and performing an etching process using an etching gas to which a gas containing nitrogen atoms has been added, thereby etching away said contact window regions of said insulating layer through said openings of said etching mask layer to form said contact windows.

In a preferred embodiment, amount of the gas containing nitrogen atoms is greater than 4.5% of amount of said etching gas excluding a dilution gas.

In a preferred embodiment, the etching gas is partially ionized.

In a preferred embodiment, ion energy of the partially ionized etching gas at a surface of the metal layer is kept below approximately 250 eV at least after the surface of said metal layer is exposed through said contact windows in the insulating layer.

In a preferred embodiment, the etching gas is ionized and the etching process is performed in an apparatus selected from a group comprising a high pressure narrow gap RIE apparatus, a plasma etching apparatus and an ECR etching apparatus.

In a preferred embodiment, an etching gas to which the gas containing nitrogen atoms has not been added is used to etch the insulating layer until surface of the metal layer is exposed, and after the surface of the metal layer is exposed, said etching gas including said gas containing nitrogen atoms is used.

Thus, the invention described herein makes possible the objectives of: (1) providing a method of forming contact windows in which highly reliable multi-level interconnections through the contact windows is achieved; (2) providing a method of forming contact windows in which almost no deposit remained on the side wall of the contact windows after the cleaning process; and (3) providing a method of forming contact windows in an insulating layer which is deposited over metal layers wherein sputtering of the metal layers is sufficiently suppressed.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
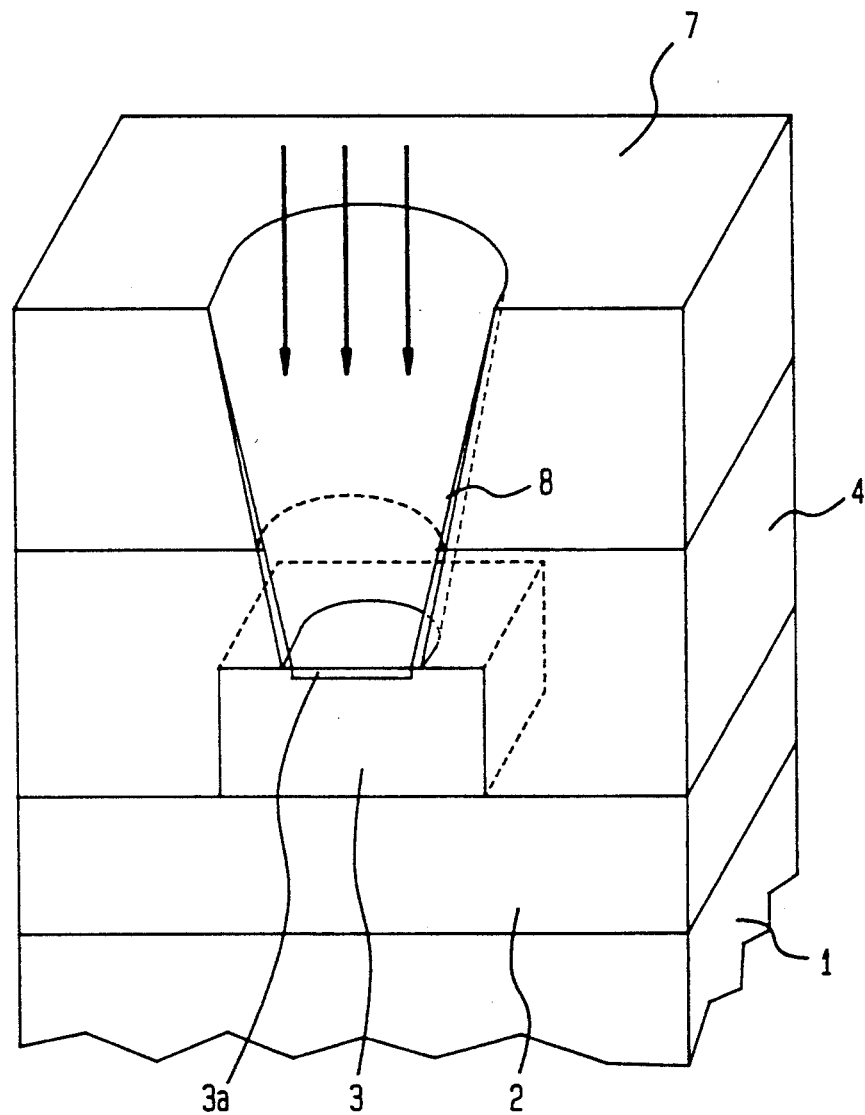
FIG. 1 shows an etching process of a method of forming contact windows of the invention.

Referring to FIG. 1, we will describe a method for forming contact windows of the invention. First, the first insulating layer 2 was formed on the silicon substrate 1. The metal layer 3 was then deposited on the first insulating layer 2 by a sputtering technique. In the embodiment, the metal layer 3 was an aluminum alloy containing 2% silicon. However, any other metals which is composed of any other alloys of aluminum, a pure aluminum, or refractory metals may be used as a material of the metal layer 3. The metal layer 3 was then patterned in fine line patterns by a lithography technique. Next, the second insulating layer 4 was deposited, by a CVD method using TEOS as a deposition gas, on the first insulating layer 2 to cover the metal layer 3. A photoresist layer 7 which functions as an etching mask was formed on the second insulating layer 4. The photoresist layer 7 was then patterned by an exposure and developing sequence to form the etching mask having openings for defining contact window regions of the second insulating layer 4 on the second insulating layer 4.

In the description below, the metal layer 3, the insulating layers 2 and 4, and the silicon substrate 1 are all collectively referred to as the wafer.

After the wafer was introduced into an RIE apparatus, an etching gas was introduced into an etching chamber of the apparatus. A mixed gas of $CHF_3$, $O_2$ and He to which $N_2$ was added was used as the etching gas. The flow rates of $CHF_3$, $O_2$ and He were 90 sccm, 10 sccm and 100 sccm, respectively. In this embodiment, the flow rate of $N_2$ was 5 sccm. Helium was employed as a dilution gas.

The etching gas was discharged by applying an RF voltage between the electrodes in the RIE apparatus and the gas was partially ionized. The RF power was 300 W. The etching gas was converted to a plasma by the discharge. The etching gas plasma came in contact with the wafer in the RIE apparatus and etched anisotropically the contact window region of the second insulating layer 4 through the opening of the etching mask layer (the photoresist layer) 7.

The etching of the second insulating layer 4 was performed under the 50% over-etching condition. Therefore, even after the surface 3a of the metal layer 3 was exposed to the etching gas plasma through the contact window, an interaction between the surface of the metal layer 3 and the etching gas plasma was maintained for a short period. Since $N_2$ was added to the etching gas used in the embodiment, the surface 3a of the metal layer 3 was nitrided by the above interaction. This nitriding occurs using any other etching gas to which a gas containing nitrogen atoms is added. Therefore, the nitriding of the surface 3a of the metal layer 3 occurs when $NH_4$ or $NF_3$ is used instead of $N_2$ as the gas containing nitrogen atoms.

Since the nitrided surface 3a of the nitrided metal layer 3 was not susceptible to sputtering, when the ions of the etching gas plasma bombard the surface 3a of the nitrided metal layer 3, almost no sputtering of the metal layer 3 occurred. Therefore, implantation of the metal or metal compound making up the metal layer 3 into the deposit 8 on the side wall of the contact window was suppressed. This almost completely prevented hardening of the deposit 8, and as described below, the deposit 8 was more easily removed by a cleaning process subsequent to the etching process.

Figure 2A:
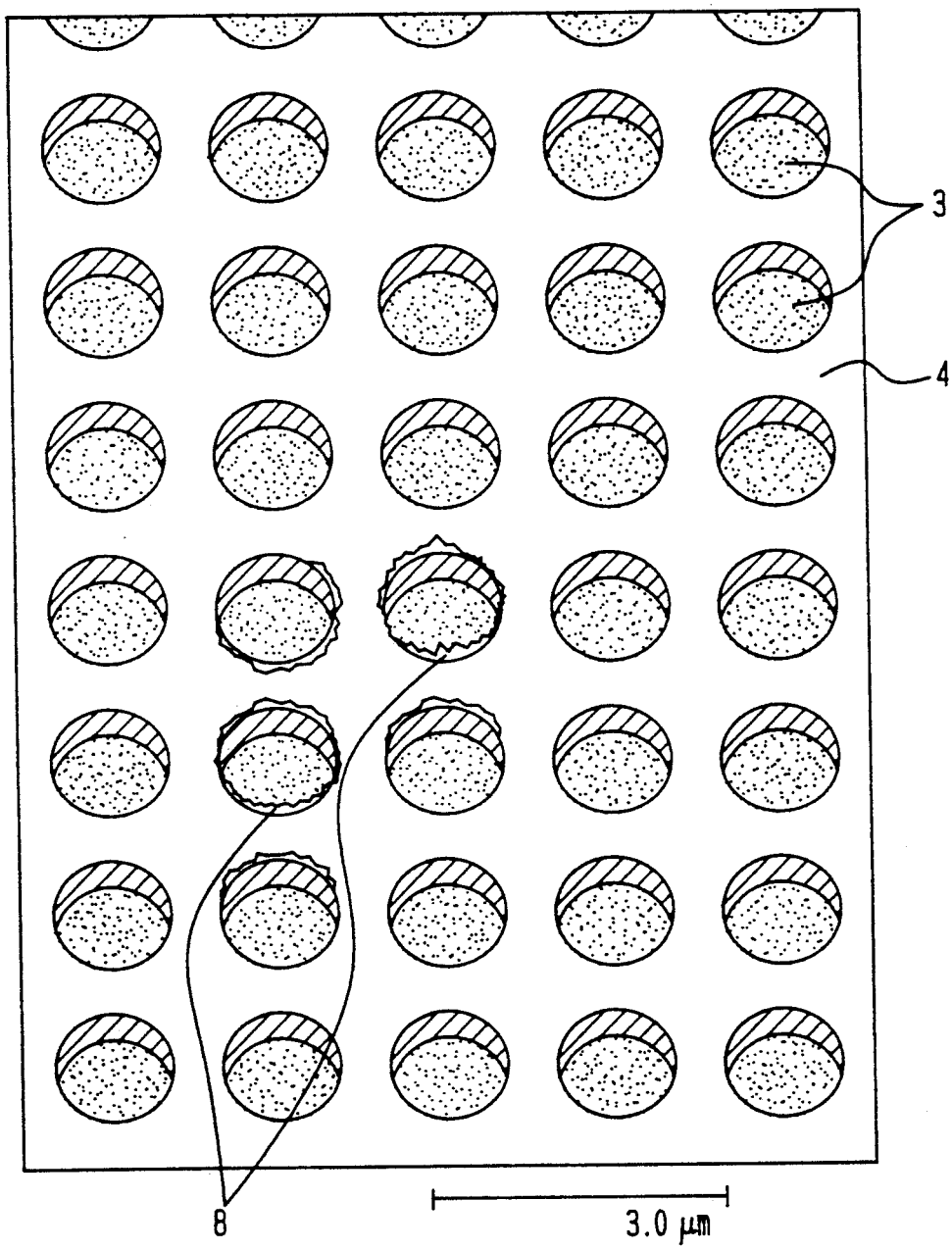
FIG. 2A is a perspective view showing contact windows formed by the method of the first embodiment of the invention.

The wafer was subjected to the resist-removing process and the cleaning process after the above etching process. The resist-removing process was performed by using an $O_2$ plasma ashing technique. The cleaning process was performed with nitric acid for 5 minutes and with pure water for 10 minutes. FIG. 2A shows the surface of the wafer after the above resist-removing process and cleaning process. The cleaning removed the photoresist 7 and exposed the surface of the second insulating layer 4. Almost no deposit 8 remained on the side wall of the contact windows. The small amount of remaining deposits 8 were completely removed by repeating the above cleaning process one more time.

All the remaining deposits 8 that has been slightly hardened can be removed away from the wafer by repeating the above cleaning process. However, it was found that the metal layer 3 became more susceptible to corrosion with the longer and more times the cleaning process was performed. Corrosion of the metal layer 3 reduces the yield of semiconductor production and degrades reliability, so it is desirable to completely remove the deposit 8 without increasing the period of time or number of times the cleaning process is performed.

Figure 2B:
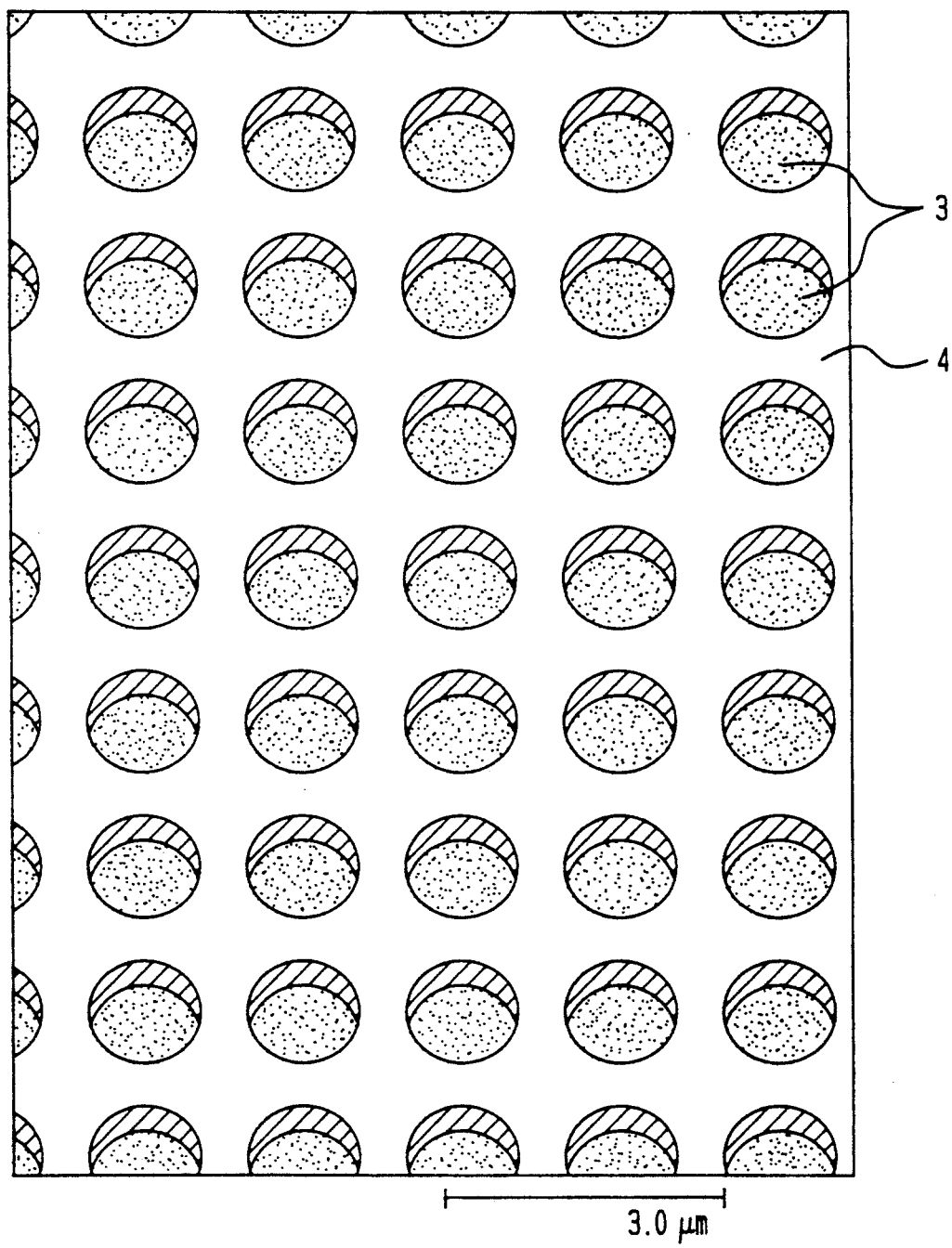
FIG. 2B is a perspective view showing contact windows formed by a second embodiment of the invention.
Figure 3:
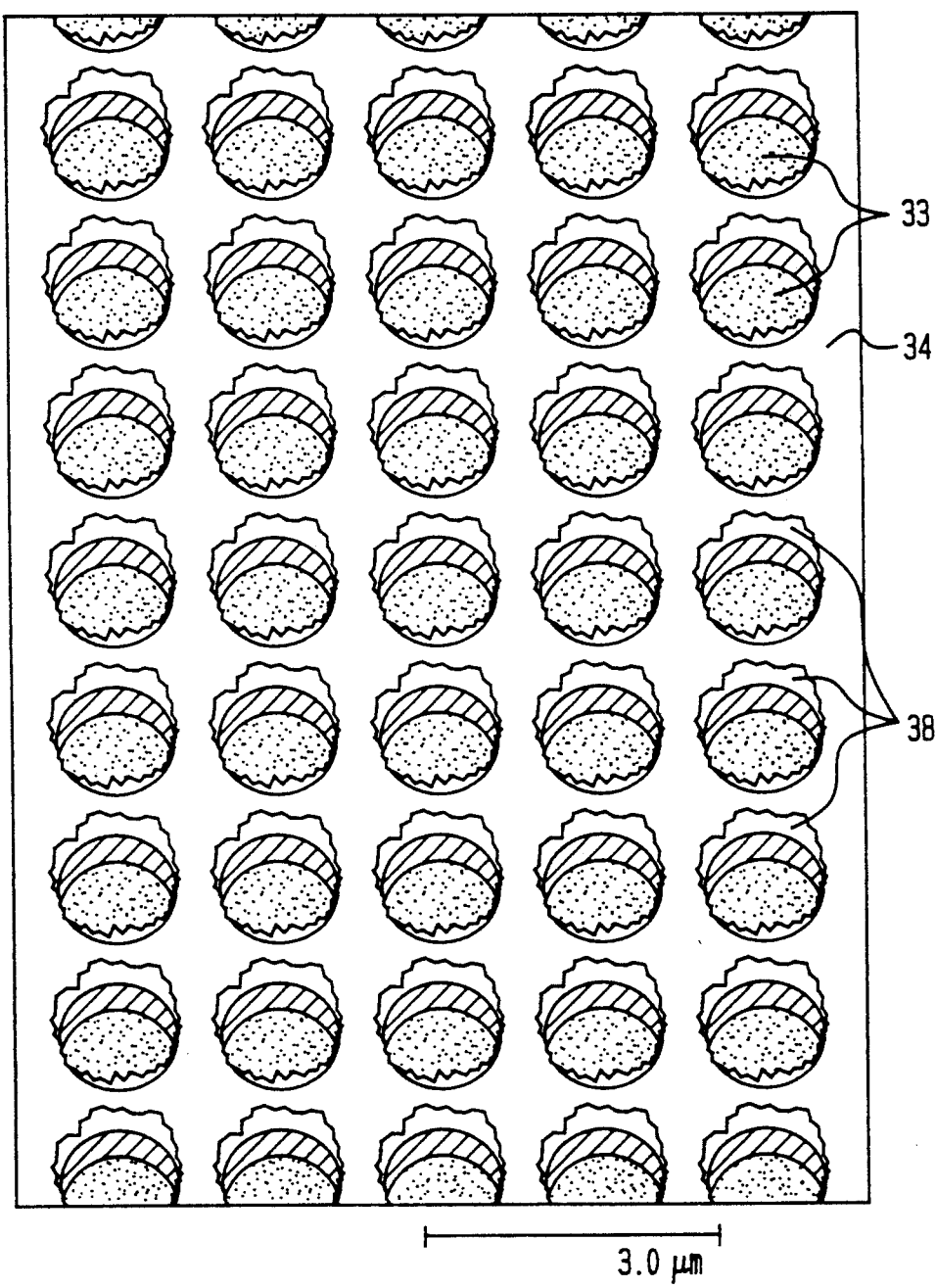
FIG. 3 is a perspective view showing contact windows formed by the prior art method.
Figure 4:
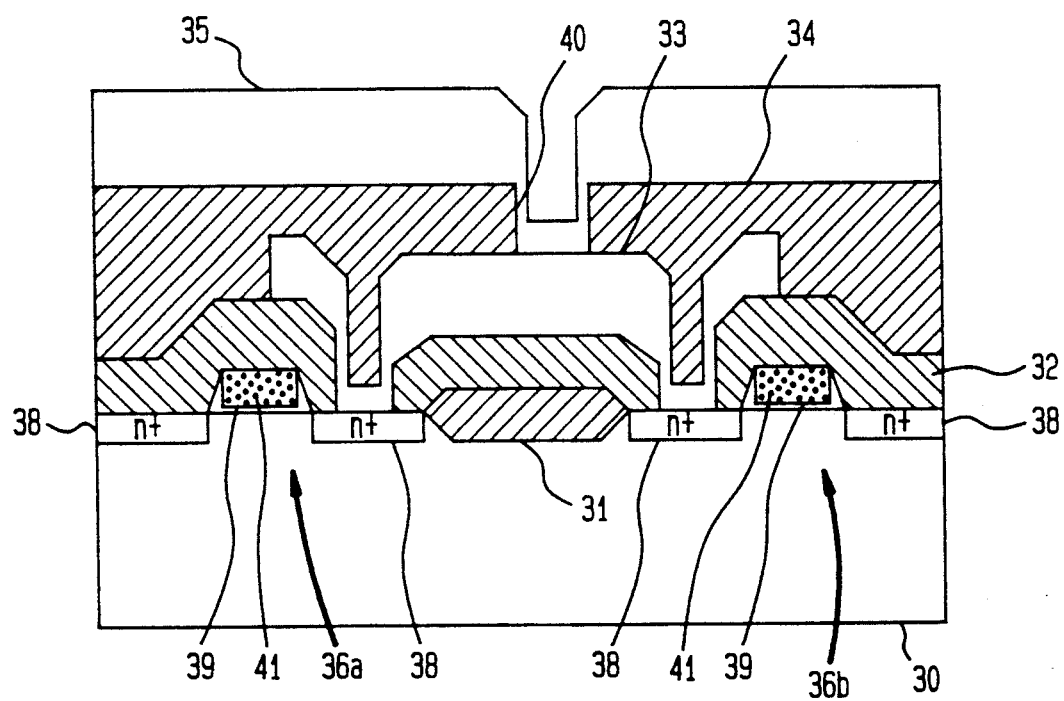
FIG. 4 is a fragmentary cross sectional view showing a semiconductor device with a two-layer interconnection structure.
Figure 5:
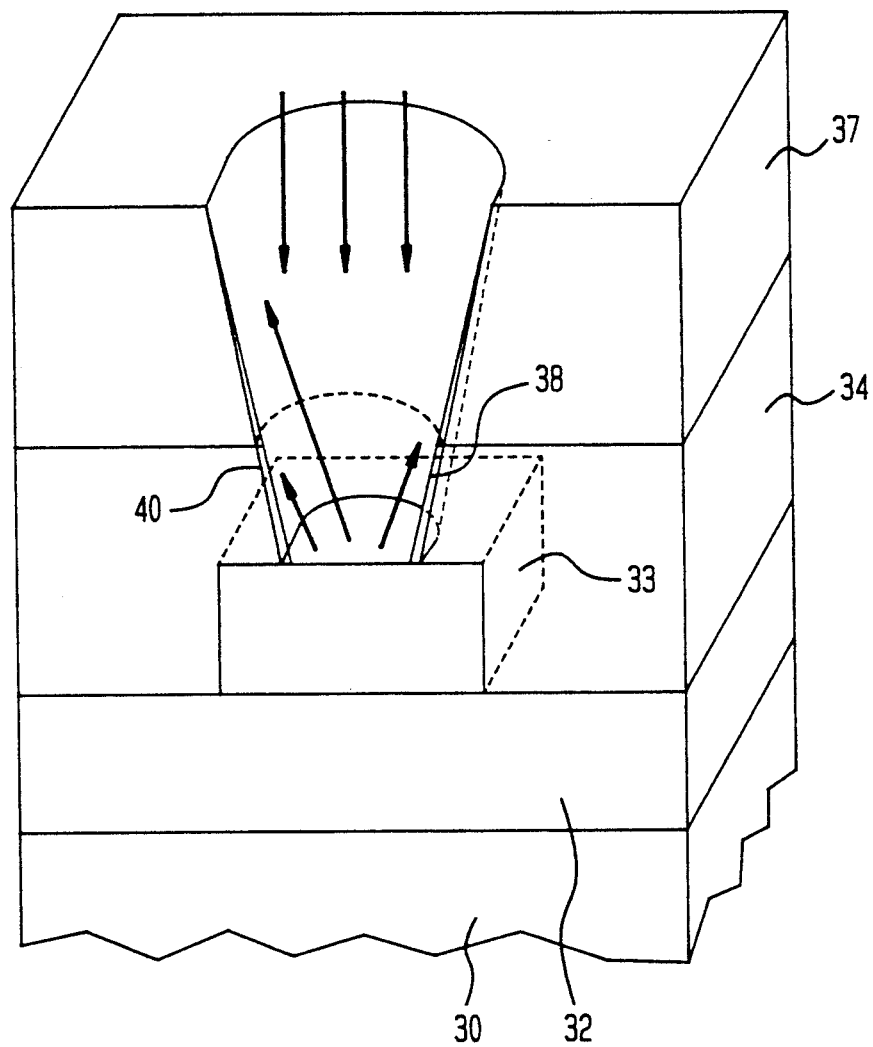
FIG. 5 shows an etching process in a prior art method of forming contact windows.

FIG. 2B shows contact windows formed by the second embodiment of the invention which utilized an etching gas with an increased $N_2$ content. A method of forming these contact windows was the same as the method of the first embodiment except that the flow rate of $N_2$ was 10 sccm. After a resist-removing process was performed using an $O_2$ plasma ashing technique, a cleaning process was performed with nitric acid for 5 minutes and with pure water for 10 minutes. As shown in FIG. 2B, deposits 8 were completely removed away from the wafer with only one cleaning process.

Experiments showed that the deposit 8 could be easily removed if the amount of the gas containing nitrogen atoms was greater than 4.5% of the amount of the etching gas, excluding the dilution gas. When the amount of gas containing nitrogen atoms was less than 4.5% of the amount of the etching gas, excluding the dilution gas, nitriding of the surface 3a of the metal layer 3 was insufficient, so sputtering of the metal layer 3 could not be sufficiently suppressed. Therefore, the amount of gas containing nitrogen atoms be preferably greater than 4.5% of the amount of the etching gas excluding the dilution gas.

Due to the large content of nitrogen molecules in the atmosphere, the prior art etching gas to which nitrogen has not been added may unavoidably contain a small amount of nitrogen as an impurity. However, this type of etching gas is not the same as an etching gas to which nitrogen has been added, so using the prior art etching gas will not yield sufficient nitriding of the surface 3a of the metal layer 3 to suppress its sputtering.

As described above, by means of the method of forming contact windows of the invention wherein the etching gas nitrides the surface 3a of the metal layer 3 during the etching process, the ratio of sputtering of the metal layer 3 by ions (sputtering ratio) is reduced. When the sputtering ratio of the metal layer 3 is further reduced, hardening of the deposit 8 is further suppressed. The sputtering ratio is also strongly dependent on the energy of the incident ions. The energy of the ions accelerated across the sheath potential is reduced by reducing the RF power for discharging the etching gas. Therefore, the sputtering ratio can be reduced by reducing the RF power. Experiments showed that, when the energy of the ions incident on the wafer was raised above 250 eV by increasing the RF power, the amount of deposit remaining after the cleaning process was increased. Therefore, the etching is preferably performed under conditions in which the ion energy is less than 250 eV.

Figure 6:
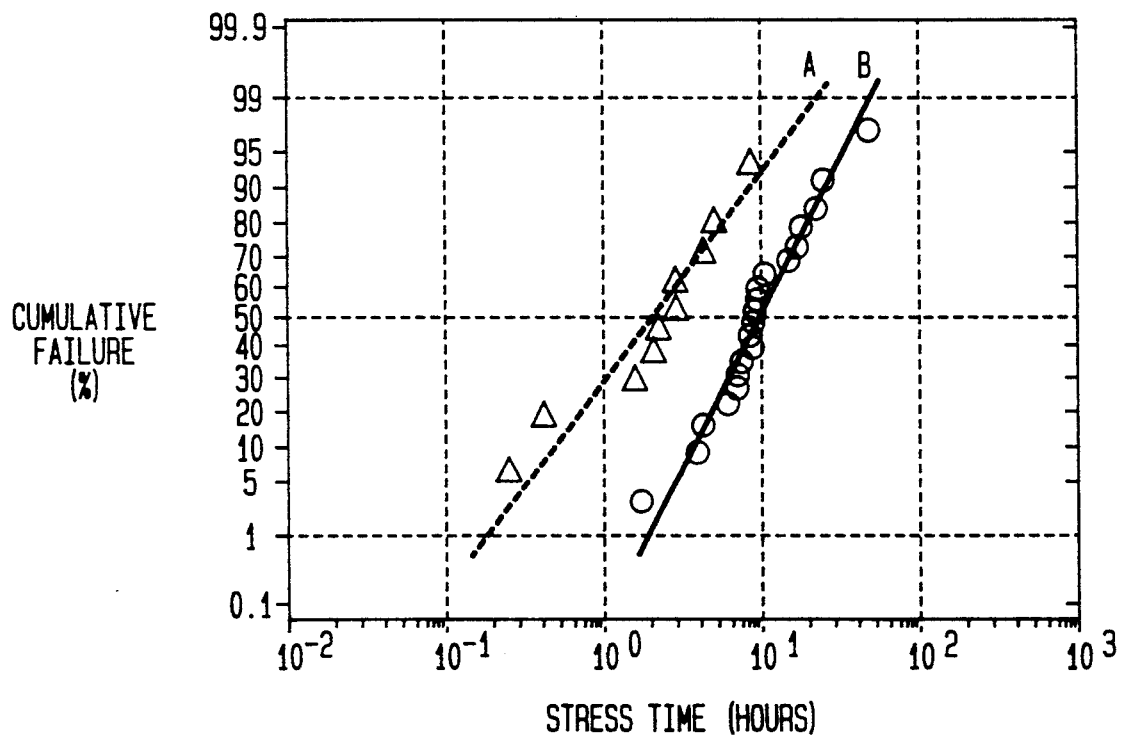
FIG. 6 is a graph showing test results for contact chains reliability.

FIG. 6 shows the results of experiments on the reliability of the contact chains. In FIG. 6, the data aggregate indicated by A is for the reliability of contact chains connected via contact windows formed using etching gas containing $CHF_3$ (flow rate: 90 sccm) and $O_2$ (flow rate: 10 sccm). The data aggregate indicated by B is for the reliability of contact chains connected via contact windows formed using a mixed etching gas of $CHF_3$ (flow rate: 90 sccm) and $O_2$ (flow rate: 10 sccm) to which $N_2$ (flow rate: 10 sccm) was added. The metal layer was aluminum containing 2% silicon. All the contact windows were formed by etching in a high pressure narrow gap RIE apparatus. Also, all the etching process were performed under the condition of 50% over-etching at an RF power of 350 W with an etching gas pressure of 150 Pa. After the etching process, all the contact windows were cleaned with nitric acid for 5 minutes and pure water for 10 minutes. The diameter of the contact window of the contact chain was 1.2 $\mu$m, and the number of contact windows was 500. The reliability experiments were performed using a current of 28.8 mA at a temperature of 150° C.

The data aggregate indicated by A showed that the mean time before failure of contact chains having contact windows formed using an etching gas to which N2 had not been added was 0.3 years. The data aggregate indicated by B, however, showed that the mean time before failure of contact chains having contact windows formed using an etching gas to which $N_2$ had been added was 1.8 years.

As described above, the contact chains having the contact windows formed using the etching gas to which $N_2$ had been added demonstrated high reliability.

In all of the above methods, the etching process was performed using the etching gas to which $N_2$ had already been added from the time etching of the second insulating layer 4 was begun. However, in addition to the above etching methods, etching can be performed using a regular etching gas to which gas containing nitrogen atoms has not been added until the metal layer 3 is exposed to the etching gas, and then after the surface of the metal layer 3 has been exposed to the etching gas, the etching can be continued using an etching gas to which gas containing nitrogen atoms has been added. This is because nitriding of the metal layer 3 becomes possible only when the surface 3a of the metal layer 3 is exposed through the contact window.

It is not necessary that the ion energy of the etching gas plasma at the surface of the metal layer 3 be less than 250 eV at the time etching begins. Sputtering of the metal layer 3 does not begin until the surface 3a of the metal layer 3 is exposed to the etching gas plasma through the contact window. Therefore, even if the ion energy is greater than about 250 eV until the surface 3a of the metal layer 3 is exposed to the etching gas plasma, hardening of the deposit B by sputtering of the metal layer 3 can be suppressed by lowering the ion energy below 250 eV after the surface 3a of the metal layer 3 becomes exposed to the etching gas plasma.

Even though the ion energy is dropped below 250 eV by reducing the RF power, a high pressure narrow gap RIE apparatus, a plasma etching apparatus, or an ECR etching apparatus can be used as the etching apparatus to increase the throughput of the etching process. These apparatus realize a high etching rate using relatively low energy ions. For example, an etching rate of 200 nm/min can be achieved with an RF power of 350 W and an ion energy of 150 eV using a high pressure narrow gap RIE etching apparatus.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of forming contact windows in an insulating layer, said contact windows extending down to an underlying aluminum alloy layer which is formed under said insulating layer, said method comprising the steps of:

forming an etching mask layer having openings for defining contact window regions of said insulating layer on said insulating layer;

performing an etching process using an etching gas to which $N_2$ has been added, thereby etching away said contact window regions of said insulating layer through said openings of said etching mask layer to form said contact windows, thereby exposing a surface of said underlying aluminum alloy layer;

nitriding said exposed surface of said underlying aluminum alloy layer through said contact windows using said etching gas;

removing said etching mask layer from said insulating layer; and forming a wiring layer on said insulating layer so that said wiring layer and said underlying aluminum alloy layer are in contact with each other through said contact windows.

2. A method of forming contact windows according to claim 1, wherein amount of said $N_2$ is greater than 4.5% of amount of said etching gas excluding a dilution gas.

3. A method of forming contact windows according to claim 1, wherein said etching gas is partially ionized.

4. A method of forming contact windows according to claim 3, wherein ion energy of said partially ionized etching gas at a surface of said metal layer is kept below approximately 250 eV at least after said surface of said metal layer is exposed through said contact windows in said insulating layer.

5. A method of forming contact windows according to claim 3, wherein said etching gas is ionized and said etching process is performed in an apparatus selected from a group comprising a high pressure narrow gap RIE apparatus, a plasma etching apparatus and an ECR etching apparatus.

6. A method of forming contact windows according to claim 1, wherein an etching gas to which said $N_2$ has not been added is used to etch said insulating layer until said surface of said metal layer is exposed, and after said surface of said metal layer is exposed, said etching gas including said $N_2$ is used.

7. A method of forming contact windows in an insulating layer, said contact windows extending down to an underlying metal layer which is formed under said insulating layer, said method comprising the steps of:

forming an etching mask layer having openings for defining contact window regions of said insulating layer on said insulating layer;

performing an etching process using a first etching gas to which a gas containing nitrogen atoms has not been added, thereby etching away said contact window regions of said insulating layer through said openings of said etching mask layer to form said contact windows, thereby exposing a surface of said underlying metal layer; and nitriding said exposed surface of said underlying metal layer through said contact windows using a second etchings gas to which a gas containing nitrogen atoms has been added.

* * * * *

UNITED STATES PATENT AND TRADEMARK OFFICE
CERTIFICATE OF CORRECTION

PATENT NO. : 5,254,213
DATED : October 19, 1993
INVENTOR(S) : Tamaki

It is certified that error appears in the above-indentified patent and that said Letters Patent is hereby corrected as shown below:

Column 5, line 3, delete "$NH_4$" and insert --$NH_3$--.

Column 8, line 50, delete the word "etchings" and insert --etching--.

Signed and Sealed this

Thirteenth Day of September, 1994

Attest:

BRUCE LEHMAN

*Attesting Officer*     *Commissioner of Patents and Trademarks*